US008964809B2

(12) United States Patent
Yoneda et al.

(10) Patent No.: US 8,964,809 B2
(45) Date of Patent: Feb. 24, 2015

(54) SEMICONDUCTOR OPTICAL INTEGRATED DEVICE

(75) Inventors: Yoshihiro Yoneda, Yokohama (JP); Masaki Yanagisawa, Yokohama (JP); Kenji Koyama, Yokohama (JP); Hirohiko Kobayashi, Yokohama (JP); Kenji Hiratsuka, Yokohama (JP)

(73) Assignee: Sumitomo Electric Industies, Ltd, Osaka (JP)

( * ) Notice: Subject to any disclaimer, the term of this patent is extended or adjusted under 35 U.S.C. 154(b) by 288 days.

(21) Appl. No.: 13/597,375

(22) Filed: Aug. 29, 2012

(65) Prior Publication Data

US 2013/0058371 A1 Mar. 7, 2013

(30) Foreign Application Priority Data

Sep. 1, 2011 (JP) ................................. 2011-190898

(51) Int. Cl.
| | |
|---|---|
| *H01S 5/00* | (2006.01) |
| *H01S 5/024* | (2006.01) |
| *H01S 5/026* | (2006.01) |
| *H01S 5/06* | (2006.01) |
| *H01S 5/227* | (2006.01) |
| H01S 5/042 | (2006.01) |
| H01S 5/0625 | (2006.01) |
| H01S 5/343 | (2006.01) |
| H01S 5/20 | (2006.01) |

(52) U.S. Cl.
CPC ............ *H01S 5/02461* (2013.01); *H01S 5/0261* (2013.01); *H01S 5/0612* (2013.01); *H01S 5/2275* (2013.01); *H01S 5/0425* (2013.01); *H01S 5/06256* (2013.01); *H01S 5/3434* (2013.01); *H01S 5/209* (2013.01)
USPC ........................................ 372/50.11; 372/50.1

(58) Field of Classification Search
CPC . H01S 5/02461; H01S 5/0261; H01S 5/2275; H01S 5/0612; H01S 5/0425; H01S 5/209; H01S 5/06256; H01S 5/3434
USPC ............................................... 372/50.1, 50.11
See application file for complete search history.

(56) References Cited

U.S. PATENT DOCUMENTS 5,991,322 A * 11/1999 Takiguchi et al. .......... 372/50.11
2009/0325334 A1 * 12/2009 Kwak et al. ..................... 438/46

FOREIGN PATENT DOCUMENTS

| JP | 2007-273644 | 10/2007 |
|---|---|---|
| JP | 2007-273650 | 10/2007 |
| JP | 2007-273694 | 10/2007 |
| JP | 2007-294914 | 11/2007 |

\* cited by examiner

*Primary Examiner* — Yuanda Zhang
(74) *Attorney, Agent, or Firm* — Smith, Gambrell & Russell LLP

(57) ABSTRACT

A semiconductor optical integrated device includes a substrate having a main surface with a first and second regions arranged along a waveguiding direction; a gain region including a first cladding layer, an active layer, and a second cladding layer arranged on the first region of the main surface; and a wavelength control region including a third cladding layer, an optical waveguide layer, and a fourth cladding layer arranged on the second region of the main surface and including a heater arranged along the optical waveguide layer. The substrate includes a through hole extending from a back surface of the substrate in the thickness direction and reaching the first region. A metal member is arranged in the through hole. The metal member extends from the back surface of the substrate in the thickness direction and is in contact with the first cladding layer.

12 Claims, 16 Drawing Sheets

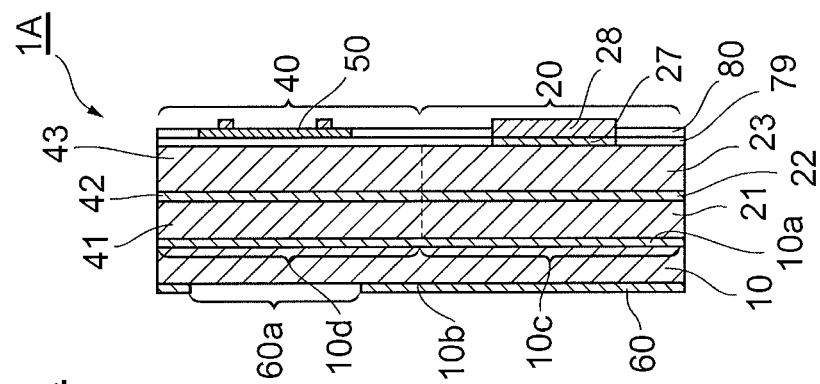
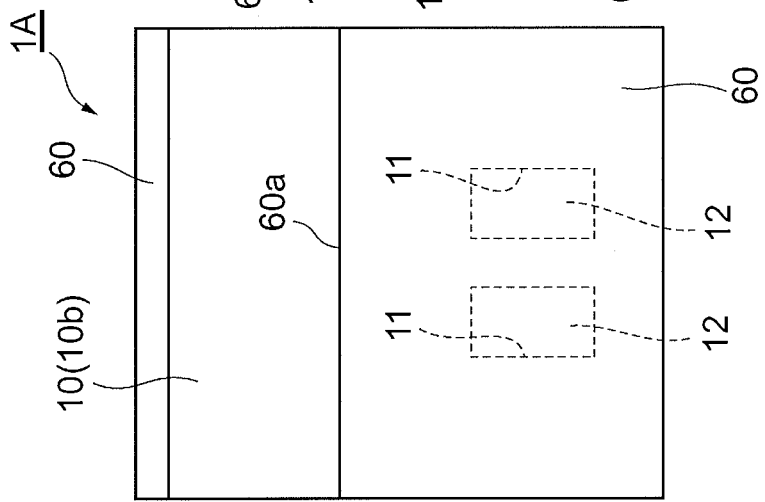
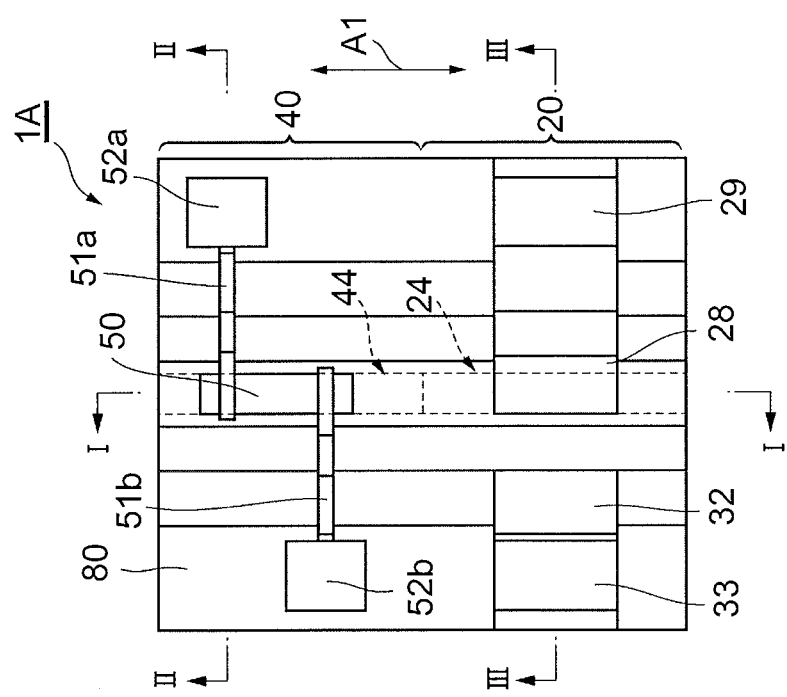

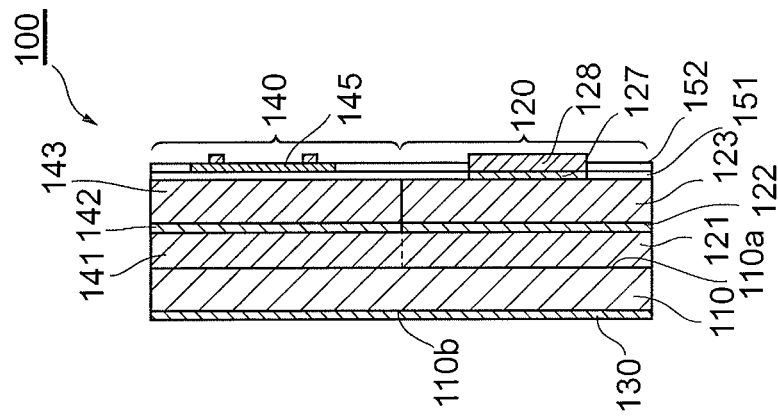
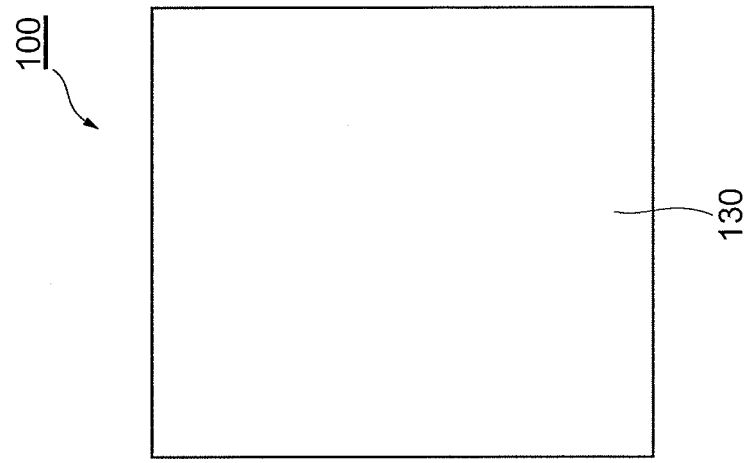
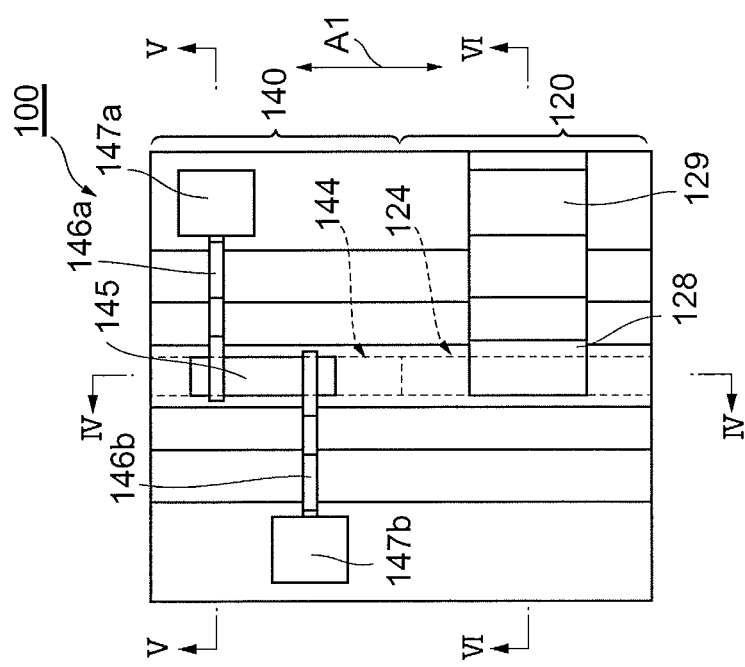

SEMICONDUCTOR OPTICAL INTEGRATED DEVICE

BACKGROUND OF THE INVENTION

1. Field of the Invention

The present invention relates to a semiconductor optical integrated device.

2. Description of the Related Art

Japanese Unexamined Patent Application Publication No. 2007-294914 discloses an optical semiconductor device having a structure configured to efficiently transfer heat from a heater to an optical waveguide layer. The optical semiconductor device includes a semiconductor substrate, a stripe-shaped semiconductor region having an upper surface and a side surface, and the heater. In the optical semiconductor device, the semiconductor substrate has a larger width than the width of the semiconductor region. The optical waveguide layer is arranged in the semiconductor region. The heater is arranged above the optical waveguide layer.

Japanese Unexamined Patent Application Publication No. 2007-273644 discloses an optical semiconductor device having a structure configured to efficiently heat an optical waveguide by a heater. The optical semiconductor device includes a semiconductor substrate, an optical semiconductor region, and the heater arranged on the optical semiconductor region. The optical semiconductor region is arranged on the semiconductor substrate and has a smaller width than the width of the semiconductor substrate. The optical semiconductor region further includes a cladding region, an optical waveguide layer, and a low thermal conductivity layer. The optical waveguide layer is arranged in the cladding region and has a higher refractive index than that of the cladding region. The low thermal conductivity layer is arranged between the optical waveguide layer and the semiconductor substrate and has a lower thermal conductivity than that of the cladding region. The low thermal conductivity layer is composed of InGaAsP, InAlGaAs, or InAlAsP.

Japanese Unexamined Patent Application Publication No. 2007-273694 discloses an optical semiconductor device having a structure configured to efficiently transfer heat from a heater to an optical waveguide. The optical semiconductor device includes an optical waveguide region having an optical waveguide layer with a diffraction grating, a heater arranged on the optical waveguide region, an electrode arranged in the vicinity of the heater, and a lead that connects the electrode and the heater. Grooves along a waveguiding direction are formed on both sides of the optical waveguide region. The lead spans the grooves.

Japanese Unexamined Patent Application Publication No. 2007-273650 discloses an optical semiconductor device having a structure configured to allow a heater to generate sufficient heat even at supplying a low voltage to the heater and configured to reduce the heat radiation from an electrode. The optical semiconductor device includes a semiconductor region having an optical waveguide and the heater arranged on the semiconductor region. A power-supplying lead line is configured to connect the electrode arranged on the heater to a wire-bonding pad. The power-supplying lead line and a ground lead line are alternately arranged in a direction along the optical waveguide.

SUMMARY OF THE INVENTION

A wavelength-tunable semiconductor laser as a semiconductor optical integrated device has a structure in which a gain region that generates light by current injection and a wavelength control region that controls an oscillation wavelength are integrated. The gain region and the wavelength control region of the wavelength-tunable semiconductor laser each constitute part of an optical waveguide structure and are optically coupled to each other. To control the oscillation wavelength, for example, a method is employed in which an optical waveguide in the wavelength control region is heated to change the effective refractive index of the optical waveguide. In such a wavelength-tunable semiconductor laser, it is desirable to suppress a change in the temperature of the optical waveguide (active layer) in the gain region to keep oscillation characteristics constant.

A semiconductor optical integrated device according to an embodiment of the present invention includes a substrate having a main surface including a first region and a second region arranged along a waveguiding direction; a gain region including a first cladding layer of a first conductivity type, an active layer, and a second cladding layer of a second conductivity type arranged on the first region of the main surface; and a wavelength control region including a third cladding layer, an optical waveguide layer, and a fourth cladding layer arranged on the second region of the main surface and including a heater arranged along the optical waveguide layer. The substrate includes a through hole that extends from a back surface of the substrate in the thickness direction and that reaches the first region of the main surface. In addition, a metal member is arranged in the through hole, the metal member extending from the back surface of the substrate in the thickness direction and being in contact with the first cladding layer. The substrate is preferably an insulating substrate or a semi-insulating substrate.

Preferably, the semiconductor optical integrated device further includes a metal film arranged on the back surface of the substrate. The metal film has an opening formed in a region superimposed on the second region when viewed from the thickness direction of the substrate.

In the semiconductor optical integrated device, preferably, the gain region further includes a stripe-shaped mesa structure including the first cladding layer, the active layer and the second cladding layer extending along the waveguiding direction. In addition, the through hole and the metal member are preferably arranged at a position that does not overlap the stripe-shaped mesa structure in the gain region when viewed from the thickness direction of the substrate.

In the semiconductor optical integrated device, preferably, the gain region further includes an etch marker layer arranged between the first cladding layer and the substrate, the etch marker layer being composed of a material different from that of the substrate so as to serve as an etching marker in forming the through hole in the substrate. In this case, more preferably, the through hole passes through the etch marker layer and reaches the first cladding layer.

In the semiconductor optical integrated device, the wavelength control region preferably includes the etch marker layer arranged between the third cladding layer and the substrate, the etch marker layer having a lower thermal conductivity than that of the third cladding layer.

In the semiconductor optical integrated device, preferably, the gain region further includes a stripe-shaped mesa structure including the first cladding layer, the active layer and the second cladding layer extending along the waveguiding direction; a first electrode arranged on a top surface of the stripe-shaped mesa structure; and a second electrode arranged on the first cladding layer other than the stripe-shaped mesa structure.

In the semiconductor optical integrated device, preferably, the wavelength control region further includes an insulating layer arranged between the fourth cladding layer and the heater. In addition, preferably, the gain region and the wavelength control region further include a diffraction grating layer having periodic projections and recesses.

BRIEF DESCRIPTION OF THE DRAWINGS

FIG. 1A is a plan view of a semiconductor optical integrated device according to an embodiment of the present invention, FIG. 1B is a bottom view of a semiconductor optical integrated device according to an embodiment of the present invention, and FIG. 1C is a cross-sectional view taken along line I-I in FIG. 1A.

FIG. 2A is a cross-sectional view taken along line II-II in FIG. 1A, and FIG. 2B is a cross-sectional view taken along line III-III in FIG. 1A.

FIGS. 15A, 15B, and 15C illustrate an exemplary semiconductor optical integrated device according to a comparative example, FIG. 15A is a plan view of the semiconductor optical integrated device, FIG. 15B is a bottom view of the semiconductor optical integrated device, and FIG. 15C is a cross-sectional view taken along line IV-IV in FIG. 15A.

FIG. 16A is a cross-sectional view taken along line V-V in FIG. 15A, and FIG. 16B is a cross-sectional view taken along line VI-VI in FIG. 15A.

DESCRIPTION OF THE PREFERRED EMBODIMENT

Figure 2A:
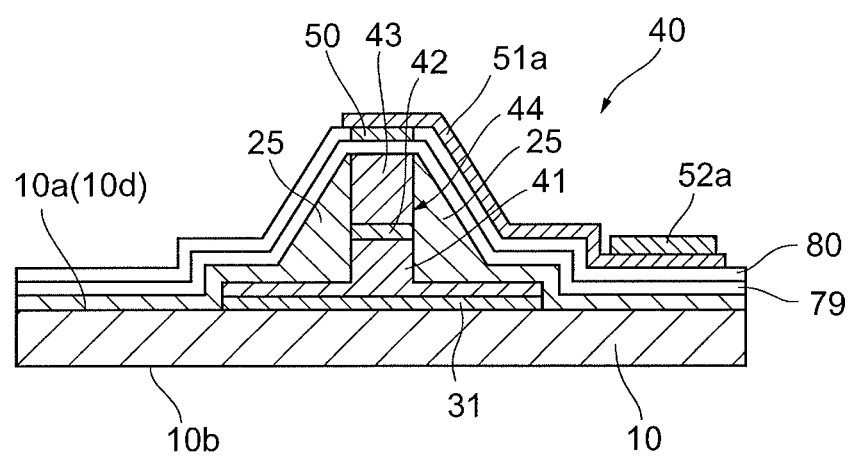
FIGS. 2A and 2B are cross-sectional views of a semiconductor optical integrated device according to an embodiment of the present invention.

An embodiment of a semiconductor optical integrated device of the present invention will be described in detail below with reference to the attached drawings. In the drawings, the same elements are designated using the same reference numerals, and descriptions are not redundantly repeated.

Figure 2B:
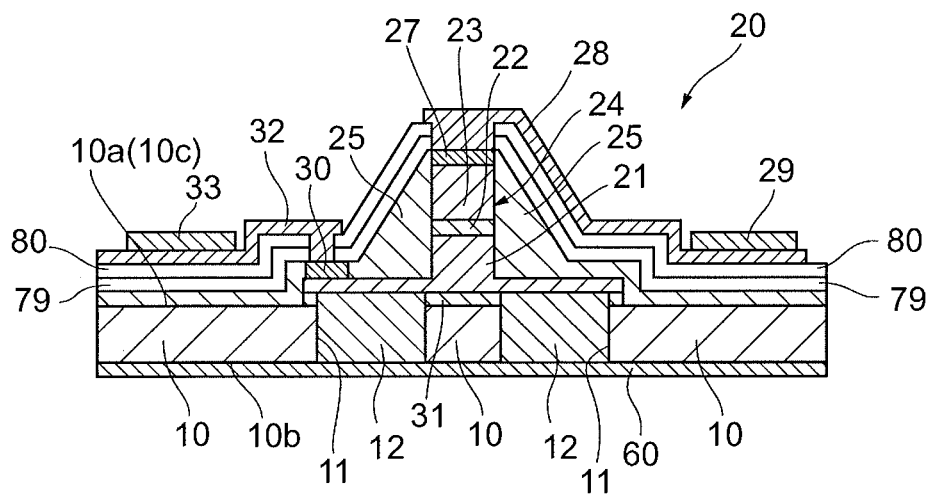

FIGS. 1A to 1C and 2A and 2B illustrate a semiconductor optical integrated device 1A according to an embodiment of the present invention. FIG. 1A is a plan view of the semiconductor optical integrated device 1A. FIG. 1B is a bottom view of the semiconductor optical integrated device 1A. FIG. 1C is a cross-sectional view taken along line I-I in FIG. 1A. FIG. 2A is a cross-sectional view taken along line II-II in FIG. 1A. FIG. 2B is a cross-sectional view taken along line III-III in FIG. 1A. As illustrated in FIGS. 1A to 1C and 2A and 2B, the semiconductor optical integrated device 1A includes a semi-insulating substrate 10, a gain region 20, and a wavelength control region 40 on a main surface 10a of the semi-insulating substrate 10.

The semi-insulating substrate 10 is composed of a semi-insulating compound semiconductor material, such as Fe-doped InP. The main surface 10a of the semi-insulating substrate 10 includes a first region 10c and a second region 10d arranged along a waveguiding direction A1. The gain region 20 and the wavelength control region 40 are arranged in the first region 10c and the second region 10d, respectively, of the main surface 10a of the semi-insulating substrate 10. The gain region 20 and the wavelength control region 40 are also arranged along the waveguiding direction A1. In other words, the gain region 20 is arranged on the first region 10c of the semi-insulating substrate 10. The wavelength control region 40 is arranged on the second region 10d of the semi-insulating substrate 10.

As illustrated in FIGS. 1C and 2B, the gain region 20 has a structure in which an n-type cladding layer 21, an active layer 22, and a p-type cladding layer 23 are stacked, in that order, on the first region 10c of the main surface 10a. The n-type cladding layer 21 serves as a first cladding layer of a first conductivity type in this embodiment. The p-type cladding layer 23 serves as a second cladding layer of a second conductivity type in this embodiment. The n-type cladding layer 21 and the p-type cladding layer 23 are composed of, for example, Si-doped InP and Zn-doped InP, respectively. The active layer 22 has a single quantum well (SQW) structure. The active layer 22 may have a multi quantum well (MQW) structure in which well layers and barrier layers are alternately stacked. The well layer is composed of, for example, InGaAsP and barrier layer is composed of, for example, InGaAsP having a composition different from that of the well layer in the SQW or MQW structure. The band-gap wavelength of the well layer is, for example, 1.6 μm. The band gap wavelength of the barrier layer is, for example, 1.25 μm. In this case, the emission wavelength from the active layer in the quantum well structure is about 1.55 μm. The active layer 22 may be formed of a single semiconductor layer with the band gap wavelength of 1.55 μm. The band gap energy Eg (eV) and the band gap wavelength $\lambda g$ (μm) satisfy the following relationship: $Eg=1.24/\lambda g$.

A diffraction grating structure (not illustrated) may be formed in the n-type cladding layer 21. The diffraction grating structure includes periodic projections and recesses which are arranged at a predetermined period in the waveguiding direction. The diffraction grating structure is composed of a diffraction grating layer and a spacer layer formed on the diffraction grating layer. The spacer layer has a lower refractive index than that of the diffraction grating layer. The periodic projections and recesses are formed in the diffraction grating layer. The spacer layer is formed so as to embed the periodic projections and recesses formed in the diffraction grating layer. Therefore, an effective refractive index of the diffraction grating structure changes periodically along the waveguiding direction at the predetermined period. The diffraction grating layer is composed of, for example, InGaAsP. The spacer layer is composed of, for example, InP.

The n-type cladding layer 21, the active layer 22, and the p-type cladding layer 23 constitute a stripe-shaped mesa structure 24. The stripe-shaped mesa structure 24 constitutes an optical waveguide extending in waveguiding direction A1, the active layer 22 arranged between the n-type cladding layer 21 and the p-type cladding layer 23 serving as a core layer. Buried layers 25 are formed on both side surfaces of the stripe-shaped mesa structure 24. The buried layer 25 is composed of a semi-insulating semiconductor, such as Fe-doped InP. Insulating films 79 and 80 are arranged on the buried layers 25. Each of the insulating films 79 and 80 is formed of a dielectric film composed of, for example, $SiO_2$, SiN, or SiON. An opening is formed in portions of the insulating films 79 and 80 on the stripe-shaped mesa structure 24. A p-type InGaAs contact layer (not illustrated) is arranged on the p-type cladding layer 23 of the stripe-shaped mesa structure 24. In this case, an electrode 27 is in ohmic contact with the p-type InGaAs layer through the opening. An end of the electrode 27 arranged on the stripe-shaped mesa structure 24 is in contact with an end of a lead 28 arranged on the insulating film 80 through the opening. The electrode 27 is composed of, for example, a AuZn or Pt alloy. The lead 28 is composed of, for example, TiW/Au or Ti/Pt/Au. A pad electrode 29 for wire bonding is arranged on the other end of the lead 28, the pad electrode 29 being formed by, for example, Au plating.

Another opening is formed in portions of the insulating films 79 and 80 on the n-type cladding layer 21. An electrode 30 is in ohmic contact with the n-type cladding layer 21 through the another opening. The electrode 30 arranged on the n-type cladding layer 21 is in contact with an end of a lead 32 arranged on the insulating film 80 through the another opening. The electrode 30 is composed of, for example, a AuGe or AuGeNi alloy. The lead 32 is composed of, for example, TiW/Au or Ti/Pt/Au. A pad electrode 33 for wire bonding is arranged on the other end of the lead 32, the pad electrode 33 being formed by Au plating.

The gain region 20 according to this embodiment further includes an etch marker layer 31 between the n-type cladding layer 21 and the semi-insulating substrate 10. The etch marker layer 31 serves as an etching marker to indicate stop timing of etching when a through hole 11 described below is formed by the etching in the semi-insulating substrate 10. The etch marker layer 31 is preferably composed of a semiconductor material, such as InGaAsP having a band gap wavelength of 1.05 μm, having a low optical absorption comparable to those of the n-type cladding layer 21. The gain region 20 may include a layer (etch stop layer) having etching selectivity for the semi-insulating substrate 10 in place of the etch marker layer 31.

In the gain region 20, two through holes 11 are formed in the semi-insulating substrate 10. These through holes 11 extend from a back surface 10b of the semi-insulating substrate 10 in the thickness direction and reach the first region 10c of the main surface 10a. In this embodiment, the through holes 11 pass through the etch marker layer 31 and reach a bottom surface of the n-type cladding layer 21. The through holes 11 are arranged at positions that do not overlap a portion to be formed into an optical waveguide (that is, the stripe-shaped mesa structure 24) in the gain region 20 when viewed from the thickness direction of the semi-insulating substrate 10. Specifically, these through holes 11 are arranged in regions along both side surfaces of the stripe-shaped mesa structure 24 when viewed from the thickness direction of the semi-insulating substrate 10.

Metal members 12 are arranged in the through holes 11. The metal members 12 are composed of, for example, Au. The metal members 12 extend from the back surface 10b of the semi-insulating substrate 10 to the n-type cladding layer 21. The metal members 12 are suitably formed by forming metal films (e.g., Pt/Ti/Pt/Au) on inner surfaces of the through holes 11 and then plating the films with Au. In this embodiment, the through holes 11 are filled with the metal members 12. In this embodiment, the through holes 11 pass through the etch marker layer 31 and reach the bottom surface of the n-type cladding layer 21. Thus, an end of each of the metal members 12 is in contact with the bottom surface of the n-type cladding layer 21. The other end of each metal member 12 is formed so as to be a flat surface between the surface of the other end of each metal member 12 and the back surface 10b of the semi-insulating substrate 10. As with the through holes 11, the metal members 12 are arranged at positions that do not overlap a portion to be formed into an optical waveguide (that is, the stripe-shaped mesa structure 24) in the gain region 20 when viewed from the thickness direction of the semi-insulating substrate 10. Specifically, the metal members 12 are arranged in regions along both side surfaces of the stripe-shaped mesa structure 24 when viewed from the thickness direction of the semi-insulating substrate 10.

As illustrated in FIGS. 1C and 2A, the wavelength control region 40 has a structure in which a lower cladding layer 41 (third cladding layer), an optical waveguide layer 42, and an upper cladding layer 43 (fourth cladding layer) are stacked, in that order, on the second region 10d of the main surface 10a. The lower cladding layer 41 is arranged as a layer common to, for example, the n-type cladding layer 21 in the gain region 20. In that case, the lower cladding layer 41 is composed of, for example, Si-doped InP. The upper cladding layer 43 is composed of, for example, Zn-doped InP. The optical waveguide layer 42 is composed of, for example, InGaAsP (with a band gap wavelength of, for example, 1.33 μm) having a higher band gap energy than that of the active layer 22. A diffraction grating structure common to the gain region 20 is arranged in the lower cladding layer 41, the diffraction grating structure including the diffraction grating having the periodic projections and recesses.

The lower cladding layer 41, the optical waveguide layer 42, and the upper cladding layer 43 constitute a stripe-shaped mesa structure 44. The stripe-shaped mesa structure 44 constitutes an optical waveguide extending in waveguiding direction A1, the optical waveguide layer 42 arranged between the lower cladding layer 41 and the upper cladding layer 43 serving as a core layer. Both side surfaces of the stripe-shaped mesa structure 44 are buried by buried layers 25 common to the gain region 20. The insulating films 79 and 80 common to the gain region 20 are arranged on the buried layers 25. In the wavelength control region 40, however, there is no opening in portions of the insulating films 79 and 80 on the stripe-shaped mesa structure 44 or on the lower cladding layer 41.

The wavelength control region 40 according to this embodiment further include the etch marker layer 31 common to the gain region 20, the etch marker layer 31 being arranged between the lower cladding layer 41 and the semi-insulating substrate 10. In the wavelength control region 40, the etch marker layer 31 serves to prevent the transfer of heat from, for example, a resistor 50 described below to the semi-insulating substrate 10.

The wavelength control region 40 further includes the resistor 50 serving as a heater. The resistor 50 is arranged on the insulating film 79 on the stripe-shaped mesa structure 44 and is arranged along the optical waveguide layer 42. As illustrated in FIG. 1A, the resistor 50 extends in waveguiding direction A1. An end of the resistor 50 in waveguiding direction A1 is connected to a pad electrode 52a through a lead 51a. The other end in waveguiding direction A1 is connected to a pad electrode 52b through a lead 51b. The resistor 50 is composed of a material, for example, TiW or NiCrSi. The resistor 50 has a thickness of, for example, 200 nm. Each of the leads 51a and 51b is composed of, for example, TiW/Au or Ti/Pt/Au. The pad electrodes 52a and 52b are formed by, for example, Au plating.

As illustrated in FIGS. 1B and 1C, the semiconductor optical integrated device 1A further includes a metal film 60 arranged on the back surface 10b of the semi-insulating substrate 10. The metal film 60 is composed of, for example, Pt/Ti/Pt/Au. For example, when the semiconductor optical integrated device 1A is mounted on a submount (chip bonding), the metal film 60 is used for connection (bonding) to the semiconductor optical integrated device 1A to a metal on the submount. The metal film 60 has an opening 60a in a region superimposed on the second region 10d (that is, in the wavelength control region 40) when viewed from the thickness direction of the semi-insulating substrate 10. When the semiconductor optical integrated device 1A is mounted, the presence of the opening 60a results in the formation of a gap between the semi-insulating substrate 10 and a mounting surface.

The semiconductor optical integrated device 1A operates as follows: In the gain region 20, when a current is injected into the active layer through the electrodes 27 and 30, light is generated in the active layer 22. The light propagates in the optical waveguide in the gain region 20 and the wavelength control region 40, thereby generating laser light. Specifically, the active layer 22 in the gain region 20 and the optical waveguide layer 42 in the wavelength control region 40 are optically coupled with each other. The light propagates in the active layer 22 and the optical waveguide layer 42. The optical waveguide including the active layer 22 in the gain region 20 and the optical waveguide layer 42 in the wavelength control region 40 constitutes a laser resonator. The laser light is emitted from one end face of the semiconductor optical integrated device 1A in waveguiding direction A1 to the outside. In the wavelength control region 40, a current is passed from the pad electrodes 52a and 52b to the resistor 50 through the leads 51a and 51b, thereby generating Joule heat in the resistor 50. The wavelength control region 40 controls the temperature of the optical waveguide layer 42 by the Joule heat, thereby controlling the effective refractive index of the optical waveguide layer 42. Therefore, the Bragg wavelength of the diffraction grating structure in the stripe-shaped mesa structure 44 can be controlled by heating the resistor 50. As a result, the wavelength of the laser light that propagates in the optical waveguide layer 42 can be selected.

An exemplary method for producing the semiconductor optical integrated device 1A according to this embodiment will be described below. FIGS. 3A to 11B are perspective views illustrating steps of the production method. FIGS. 12A to 14 are cross-sectional views illustrating the subsequent steps of the production method. FIGS. 12A, 12B, 13A, and 13B each illustrate a cross section (corresponding to a cross section taken along line III-III in FIG. 1A) perpendicular to a waveguiding direction. FIG. 14 illustrates a cross section (corresponding to a cross section taken along line I-I in FIG. 1A) in the waveguiding direction. In the following descriptions, a metal-organic vapor phase epitaxy (MOVPE) method is preferably employed for the growth of semiconductor layers.

Figure 3A:
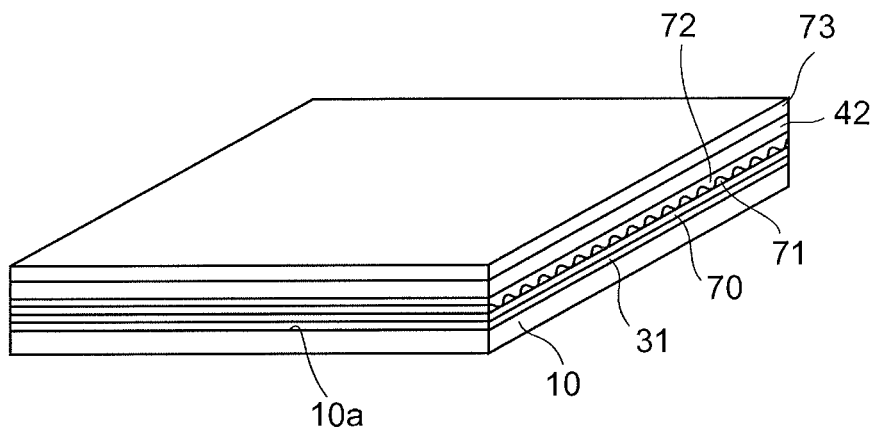
FIGS. 3A and 3B are perspective views illustrating steps in a production method according to an embodiment.

As illustrated in FIG. 3A, the etch marker layer 31, an n-type buffer layer 70, a diffraction grating layer 71, and a capping layer (not illustrated) are grown, in that order, on the main surface 10a of the semi-insulating substrate 10. The n-type buffer layer 70 is composed of, for example, n-type InP. The n-type buffer layer 70 constitutes part of each of the n-type cladding layer 21 and the lower cladding layer 41 illustrated in FIGS. 1A to 1C and 2A and 2B. The diffraction grating layer 71 is composed of, for example, InGaAsP. The capping layer is composed of, for example, InP. The thicknesses of the etch marker layer 31, the n-type buffer layer 70, the diffraction grating layer 71, and the capping layer are, for example, 200 nm, 500 nm, 70 nm, and 20 nm, respectively.

A SiN film is formed on the capping layer by a chemical vapor deposition (CVD) method. A resist is applied to the SiN film. A diffraction grating pattern is formed on the resist by an interference exposure method. The SiN film is etched with the resist serving as a mask to form a diffraction grating pattern on the SiN film. The etching of the SiN film may be performed by inductively coupled plasma reactive ion etching (ICP-RIE) with a $CF_4$-based gas. After the etching is performed until the SiN film is penetrated, the etching gas used in the ICP-RIE is switched to $O_2$ to remove the resist by ashing. Then the diffraction grating layer 71 is etched with the SiN film serving as a mask to form a diffraction grating pattern on the diffraction grating layer 71. In this case, the diffraction grating layer 71 is etched by ICP-RIE with a $CH_4/H_2$-based gas. The etching is stopped when the diffraction grating layer 71 is penetrated to expose the n-type cladding layer 21 (lower cladding layer 41). Then the SiN film is removed with hydrofluoric acid. A surface portion damaged by the RIE is removed by etching with an aqueous solution of sulfuric acid and hydrogen peroxide.

Next, semiconductor layers to be formed into the wavelength control region 40 are formed on the diffraction grating layer 71. Specifically, an n-type InP layer 72, the optical waveguide layer 42, a p-type InP layer 73, a lower capping layer, and an upper capping layer (not illustrated) are grown, in that order, on the diffraction grating layer 71. The n-type InP layer 72 is the spacer layer in the embodiment. The n-type InP layer 72 is grown on the diffraction grating layer 71 to embed the periodic projections and recesses formed in the diffraction grating layer 71. In addition, the n-type InP layer 72 constitutes part of each of the n-type cladding layer 21 and the lower cladding layer 41. The p-type InP layer 73 constitutes part of the upper cladding layer 43. The lower capping layer is composed of, for example, Zn-doped InGaAsP (with a band gap wavelength of 1.15 μm). The upper capping layer is composed of, for example, Zn-doped InP. The thicknesses of the n-type InP layer 72, the optical waveguide layer 42, the p-type InP layer 73, the lower capping layer, and the upper capping layer are, for example, 120 nm, 250 nm, 460 nm, 20 nm, and 20 nm.

Figure 3B:
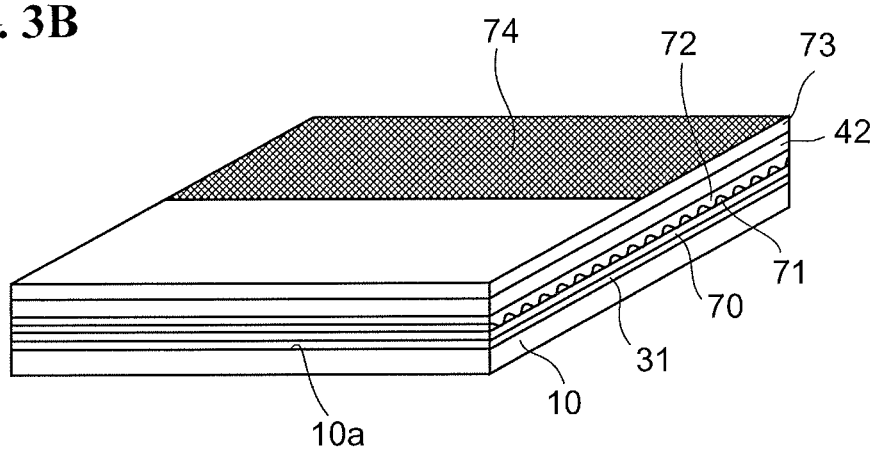

A $SiO_2$ film is formed on the p-type InP layer 73 by a CVD method. A portion of the $SiO_2$ film corresponding to the wavelength control region 40 is protected by a resist. The $SiO_2$ film is etched with the resist serving as a mask to remove a portion of the $SiO_2$ film corresponding to the gain region 20. Then the resist is removed. In this way, as illustrated in FIG. 3B, an etching mask 74 that covers a region to be formed into the wavelength control region 40 is formed.

Figure 4A:
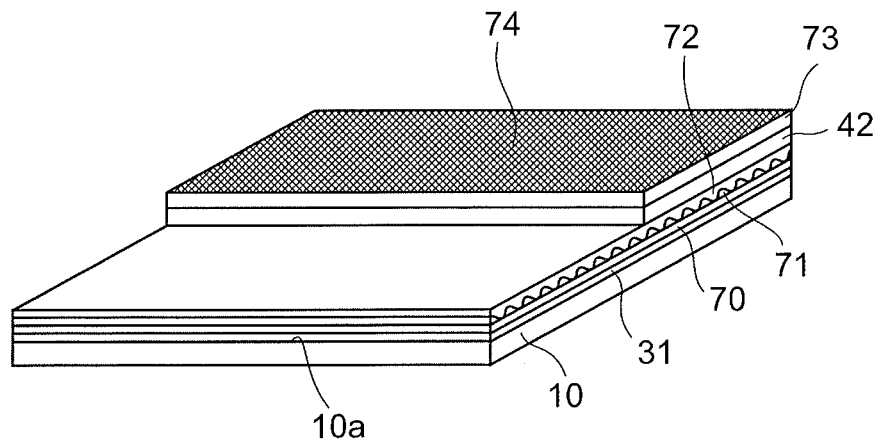
FIGS. 4A and 4B are perspective views illustrating steps in the production method according to the embodiment.

As illustrated in FIG. 4A, the upper capping layer and the lower capping layer (not illustrated), the p-type InP layer 73, and the optical waveguide layer 42 are etched with the etching mask 74. Specifically, the upper capping layer is etched with a mixed solution of hydrochloric acid, water, and acetic acid. The ratio of hydrochloric acid to water to acetic acid in the etching solution is 1:1:10 by volume. The concentration of hydrochloric acid is, for example, 36% by weight. The concentration of acetic acid is, for example, 31% by weight. The lower capping layer is etched with a mixed solution of sulfuric acid, aqueous hydrogen peroxide, and water. The ratio of sulfuric acid to aqueous hydrogen peroxide to water in the etching solution is 1:1:1 by volume. The concentration of sulfuric acid is, for example, 96% by weight. The p-type InP layer 73 is etched with a mixed solution of hydrogen bromide and water. The ratio of hydrogen bromide to water in the etching solution is 2:1 by volume. The concentration of hydrogen bromide is, for example, 47% by weight. The optical waveguide layer 42 is etched with a mixed solution of hydrochloric acid, aqueous hydrogen peroxide, and water. The ratio of hydrochloric acid to aqueous hydrogen peroxide to water in the etching solution is 1:5:5 by volume. Side surfaces of these layers (the boundary surface between the gain region 20 and the wavelength control region 40) are slightly etched. The etching in the depth direction is stopped at the n-type InP layer 72.

Figure 4B:
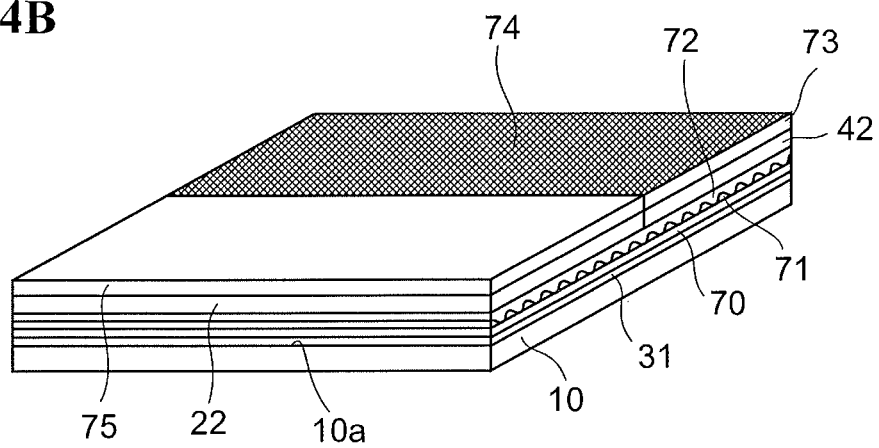

As illustrated in FIG. 4B, semiconductor layers to be formed into the gain region 20 are formed while leaving the etching mask 74. Specifically, the active layer 22 and a p-type InP layer 75 are selectively grown on the first region 10c of the main surface 10a. The p-type InP layer 75 constitutes part of the p-type cladding layer 23. In this step, a lower optical confinement layer may be grown before the growth of the active layer 22, and an upper optical confinement layer may be grown after the growth of the active layer 22. The lower optical confinement layer and the upper optical confinement layer are composed of, for example, undoped InGaAsP (with a band gap wavelength of 1.25 μm). The thicknesses of the lower optical confinement layer, the upper optical confinement layer, and the p-type InP layer 75 are, for example, 50 nm, 50 nm, and 500 nm, respectively. In the case where the active layer 22 has a multi-quantum well structure, for example, each well layer may have a thickness of 5 nm, each barrier layer may have a thickness of 10 nm, and the number of the well layers may be six. In this step, a butt-joint structure of the active layer 22 and the optical waveguide layer 42 is formed.

In the foregoing production steps, the semiconductor layers to be formed into the wavelength control region 40 are grown, and then the semiconductor layers to be formed into the gain region 20 are grown. However, the order of the growth of these regions 20 and 40 is not limited thereto. For example, the following procedure may be employed: The active layer 22 and the p-type InP layer 75 are grown on the main surface 10a. Then a mask the same as the etching mask 74 is formed on the p-type InP layer 75. The active layer 22 and the p-type InP layer 75 are etched with the mask. The optical waveguide layer 42 and the p-type InP layer 73 are selectively grown with the mask. In this case, the p-type InP layer 75 has a thickness of, for example, 460 nm. The lower cladding layer having a thickness of 20 nm and the upper capping layer having a thickness of 20 nm are grown. The p-type InP layer 73 may have a thickness of, for example, 500 nm.

Figure 5A:
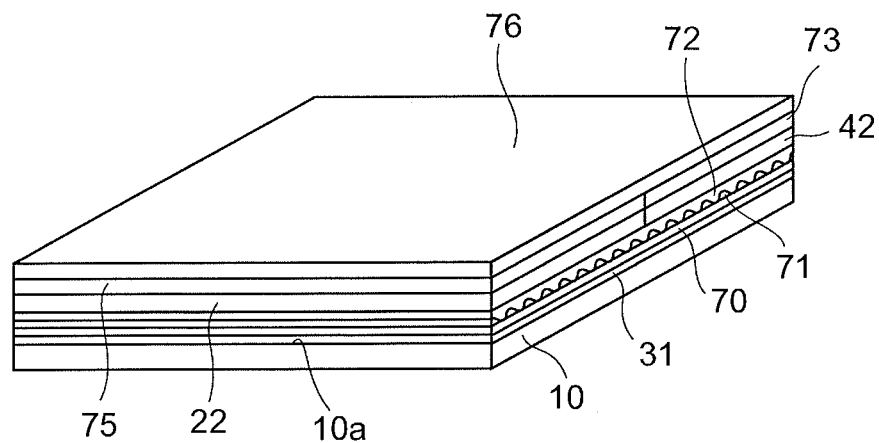
FIGS. 5A and 5B are perspective views illustrating steps in the production method according to the embodiment.

The etching mask 74 is removed with hydrofluoric acid. As illustrated in FIG. 5A, a p-type InP layer 76 is grown on the entire main surface 10a. The p-type InP layer 76 constitutes the rest portion of the p-type cladding layer 23 in the gain region 20. The p-type InP layer 76 constitutes the rest portion of the upper cladding layer 43 in the wavelength control region 40. In this step, a p-type InGaAs contact layer (not illustrated) is grown on the p-type InP layer 76.

Figure 5B:
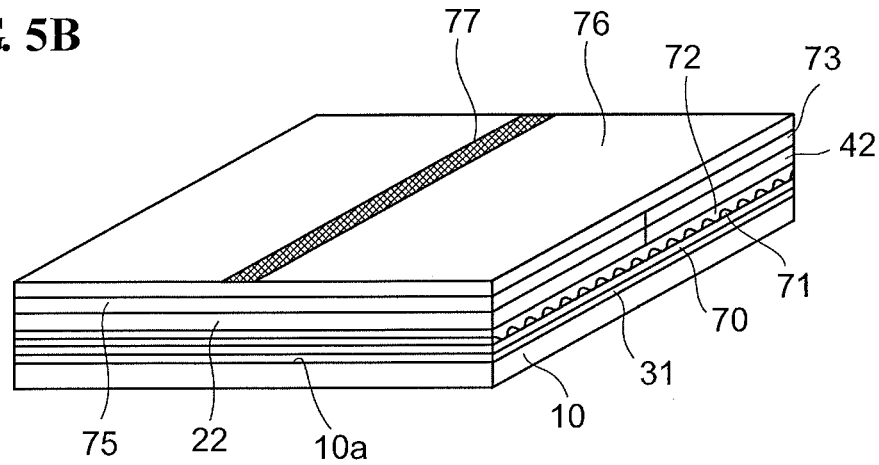

As illustrated in FIG. 5B, an etching mask 77 is formed on the p-type InP layer 76 (on the p-type InGaAs contact layer in this embodiment). Specifically, a $SiO_2$ film is formed on the p-type InP layer 76 (on the p-type InGaAs contact layer in this embodiment) by a CVD method. A portion of the $SiO_2$ film that covers a portion of the p-type InP layer 76 to be formed into the stripe-shaped mesa structures 24 and 44 is protected by a resist. The $SiO_2$ film is etched with the resist serving as a mask to form the stripe-shaped etching mask 77. After this step, the resist is removed.

Figure 6A:
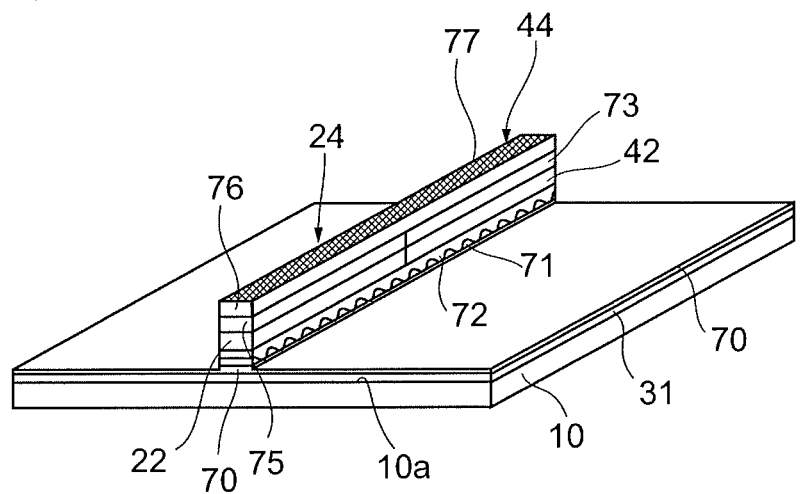
FIGS. 6A and 6B are perspective views illustrating steps in the production method according to the embodiment.

As illustrated in FIG. 6A, the layers ranging from the p-type InP layer 76 to the diffraction grating layer 71 are etched with the etching mask 77 until the n-type buffer layer 70 is exposed, thereby forming the stripe-shaped mesa structures 24 and 44. In this step, for example, ICP-RIE with a HI-based gas may be employed. The etch depth is in the range of, for example, 3.0 μm to 4.0 μm. In this step, the active layer 22 and the optical waveguide layer 42, which have different compositions, are preferably etched at substantially the same etch rate in such a manner that the resulting etched surface is flat. For example, an etching gas having a small difference in etch rate between the active layer 22 and the optical waveguide layer 42 may be selected.

Figure 6B:
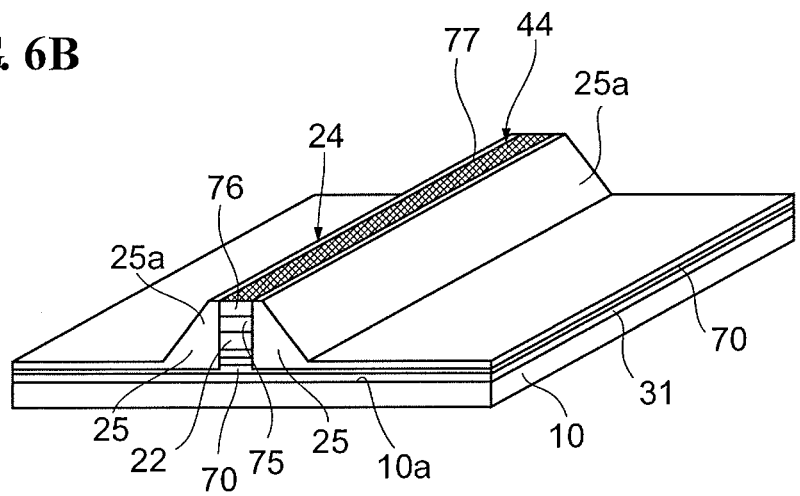
Figure 7A:
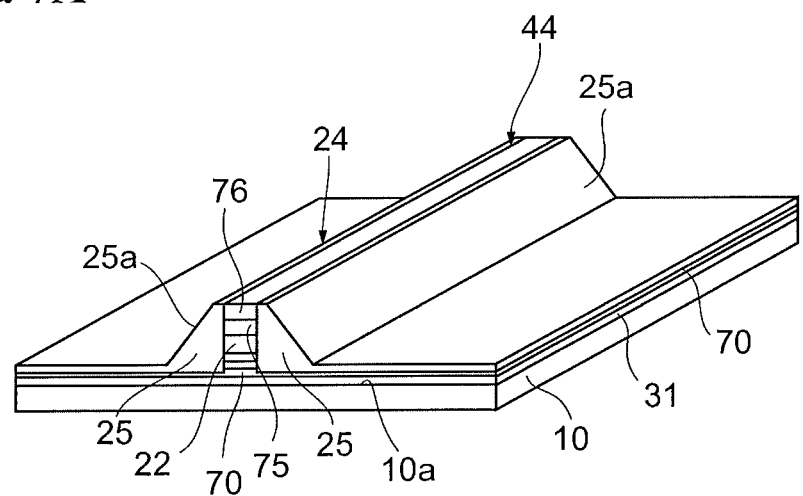
FIGS. 7A and 7B are perspective views illustrating steps in the production method according to the embodiment.

As illustrated in FIG. 6B, the buried layers 25 is grown on both side surfaces of each of the stripe-shaped mesa structures 24 and 44 and on a surface of the n-type buffer layer 70 while leaving the etching mask 77. In this step, for example, Fe-doped InP is preferably grown while 1,2-dichloroethane is added. In that case, the growth rate on both side surfaces of each of the stripe-shaped mesa structures 24 and 44 is higher than that on the surface of the n-type buffer layer 70 parallel to the main surface 10a. This results in the formation of inclined surfaces 25a on the buried layers 25, the inclined surfaces 25a extending along the stripe-shaped mesa structures 24 and 44. After this step, the etching mask 77 is removed with hydrofluoric acid (FIG. 7A).

Figure 7B:
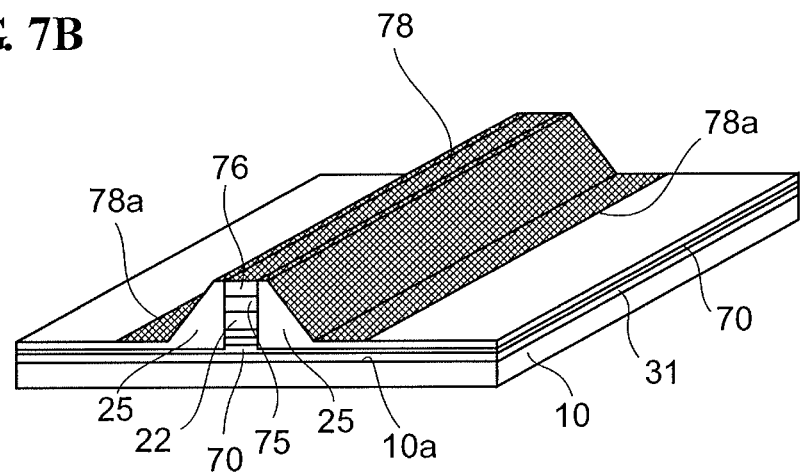

As illustrated in FIG. 7B, an etching mask 78 is formed on the stripe-shaped mesa structures 24 and 44 and the buried layers 25. The etching mask 78 is used for etching to isolate the stacked semiconductor layers of the semiconductor optical integrated device in a direction intersecting the waveguiding direction. Thus, the etching mask 78 has side edges 78a along both side surfaces of each of the stripe-shaped mesa structures 24 and 44. The etching mask 78 is preferably formed in the same way as the method for forming the etching masks 74 and 77.

Figure 8A:
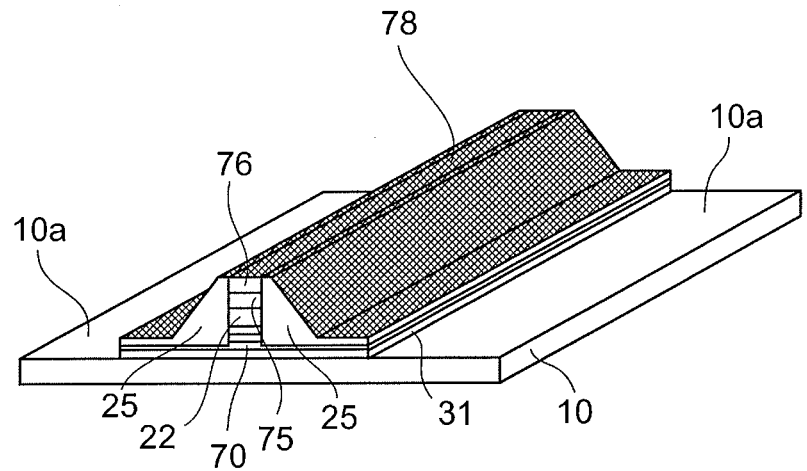
FIGS. 8A and 8B are perspective views illustrating steps in the production method according to the embodiment.

As illustrated in FIG. 8A, the buried layers 25, the n-type buffer layer 70, and the etch marker layer 31 are etched with the etching mask 78. Specifically, the buried layers 25 and the n-type buffer layer 70 are etched with a mixed solution of hydrochloric acid, water, and acetic acid (the ratio of hydrochloric acid to water to acetic acid is 1:1:10 by volume). The concentration of hydrochloric acid is, for example, 36% by weight. The concentration of acetic acid is, for example, 31% by weight. The etch marker layer 31 is etched with a mixed solution of sulfuric acid, aqueous hydrogen peroxide, and water (the ratio of sulfuric acid to aqueous hydrogen peroxide to water is 1:1:1 by volume). In this way, the main surface 10a of the semi-insulating substrate 10 is exposed.

Figure 8B:
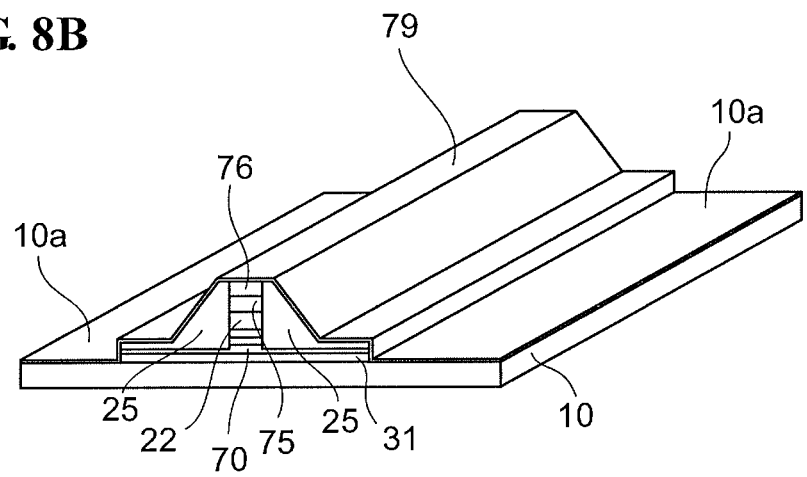

As illustrated in FIG. 8B, the insulating film 79 is formed. The insulating film 79 is arranged mainly to protect the semiconductor layers from the resistor 50 described below. The insulating film 79 is formed of, for example, a dielectric film composed of a material, such as SiO$_2$ or SiN. The insulating film 79 is formed by a CVD method and has a thickness of, for example, 200 nm.

Figure 9A:
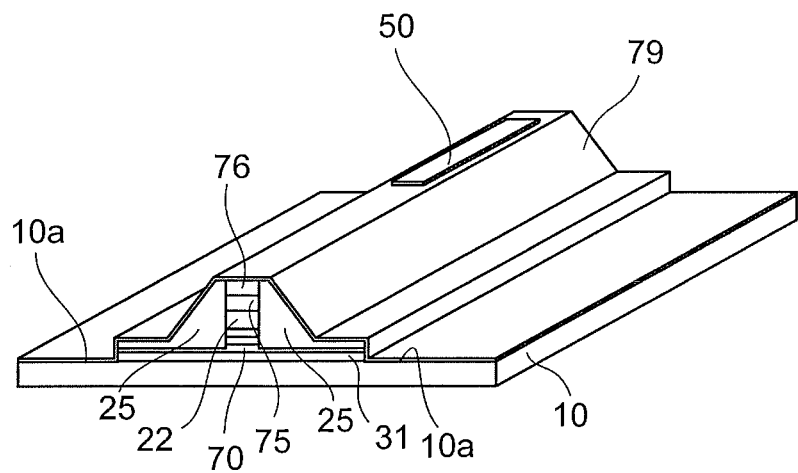
FIGS. 9A and 9B are perspective views illustrating steps in the production method according to the embodiment.
Figure 9B:
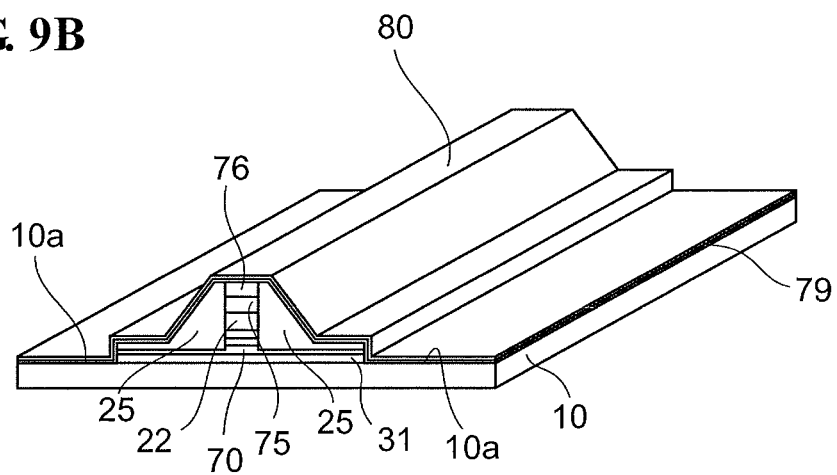

As illustrated in FIG. 9A, the resistor 50 is formed on the insulating film 79 on the stripe-shaped mesa structure 44. Specifically, a metal film (e.g., TiW film) serving as a material for the resistor 50 is formed on the entire main surface 10a. The formation of the metal film is performed by, for example, a sputtering method. An etching mask is formed on a region of the metal film to be formed into the resistor 50. A portion of the metal film that is not covered with the etching mask is removed by etching. As illustrated in FIG. 9B, the insulating film 80 configured to protect the semiconductor layers and the resistor 50 is formed on the entire main surface 10a. The insulating film 80 is formed of, for example, a dielectric film composed of a material, such as SiO$_2$ or SiN. The insulating film 80 is formed by a CVD method and has a thickness of, for example, 200 nm.

Figure 10A:
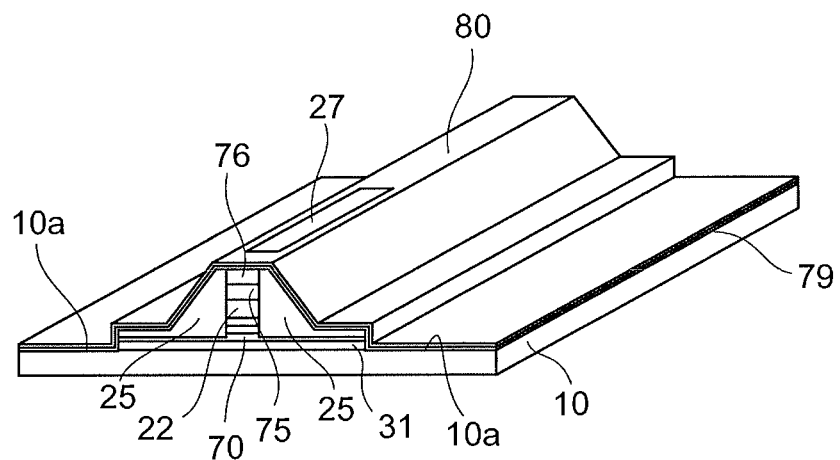
FIGS. 10A and 10B are perspective views illustrating steps in the production method according to the embodiment.

As illustrated in FIG. 10A, the electrode 27 is formed on the stripe-shaped mesa structure 24. In this step, a resist mask having an opening in a region on the stripe-shaped mesa structure 24 is formed. The insulating films 79 and 80 are etched with the resist mask, thereby forming an opening (contact hole) in portions of the insulating films 79 and 80 on the stripe-shaped mesa structure 24. Metal layers of Au/Zn/Au are deposited while leaving the resist mask. Then the electrode 27 is formed by a lift-off method. The electrode 27 is in contact with the p-type InGaAs contact layer through the opening in portions of the insulating films 79 and 80 on the stripe-shaped mesa structure 24. The electrode 27 is subjected to heat treatment at 350° C. to 420° C. so as to be alloyed with the p-type InGaAs contact layer.

Figure 10B:
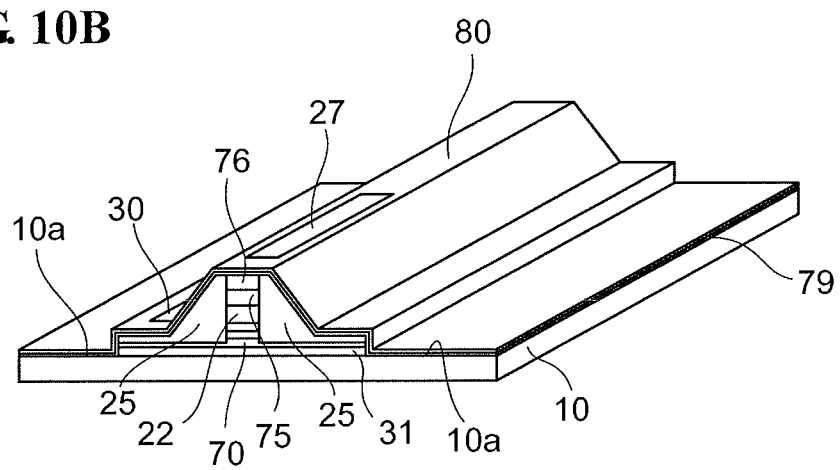

As illustrated in FIG. 10B, the electrode 30 is formed above the n-type buffer layer 70. In this step, a resist mask having an opening in a region above the n-type buffer layer 70 excluding the stripe-shaped mesa structure 24 is formed. The insulating films 79 and 80 and the buried layers 25 are etched with the resist mask. The insulating films 79 and 80 may be removed with hydrofluoric acid. The buried layers 25 may be removed with a mixed solution of hydrochloric acid, water, and acetic acid (the ratio of hydrochloric acid to water to acetic acid is 1:1:10 by volume), thereby exposing a surface of the n-type buffer layer 70. Metal layers of Au/Ge are deposited while leaving the resist mask. The electrode 30 is formed by the lift-off method. The electrode 30 is in contact with the n-type buffer layer 70 through the opening. The electrode 30 is subjected to heat treatment at 320° C. to 350° C. so as to be alloyed with the n-type buffer layer 70.

Figure 11A:
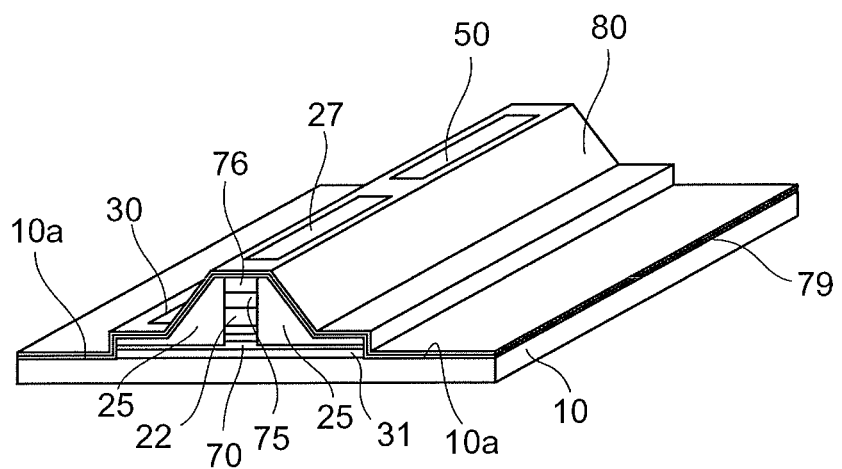
FIGS. 11A and 11B are perspective views illustrating steps in the production method according to the embodiment.

As illustrated in FIG. 11A, the resistor 50 is exposed from the insulating film 80. In this step, a resist mask having an opening corresponding to the planar shape of the resistor 50 is formed on the insulating film 80. The insulating film 80 is etched with the resist mask, thereby exposing the resistor 50 from the insulating film 80. The insulating film 80 may be removed with hydrofluoric acid.

Figure 11B:
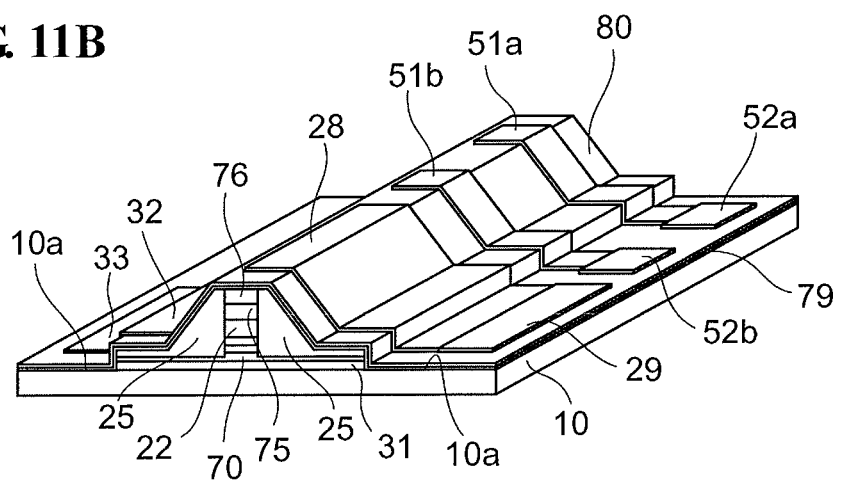

As illustrated in FIG. 11B, the leads 28, 32, 51a, and 51b and the pad electrodes 29, 33, 52a, and 52b are formed. In this step, a TiW/Au film is formed by a sputtering method on the entire main surface 10a. Portions of the TiW/Au film excluding regions to be formed into the leads 28, 32, 51a, and 51b and the pad electrodes 29, 33, 52a, and 52b are removed. Au plating is performed while the remaining TiW/Au film is energized. Etching is performed for the entire surface on the main surface 10a to remove an unnecessary portion of the resulting Au film. Thereby, the process on the main surface 10a is completed.

Figure 12A:
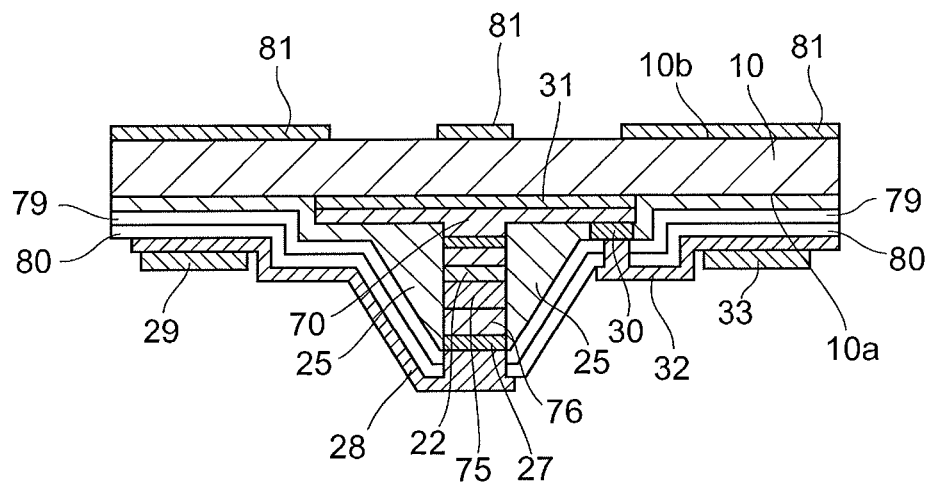
FIGS. 12A and 12B are cross-sectional views illustrating steps in the production method according to the embodiment, each of the views being a cross section (corresponding to a cross section taken along line III-III in FIG. 1A) perpendicular to a waveguiding direction.
Figure 12B:
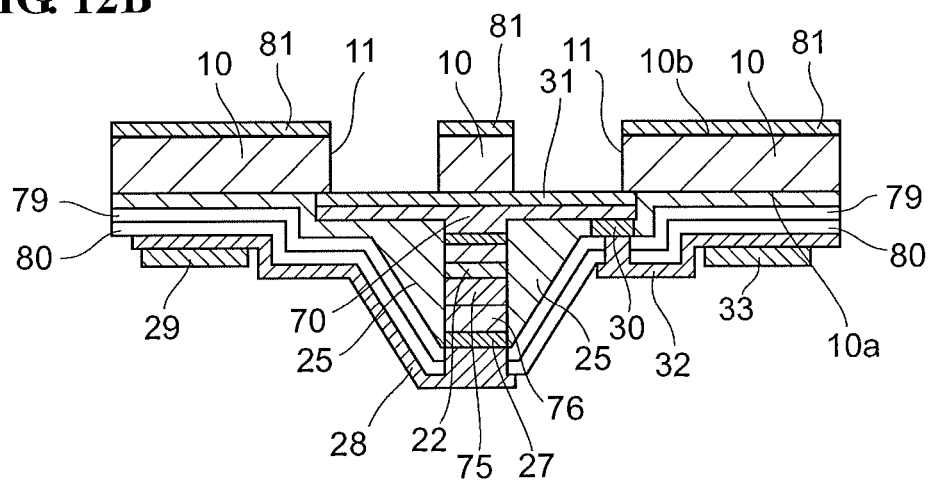

The main surface 10a side of the semi-insulating substrate 10 is protected by a resist. The back surface 10b of the semi-insulating substrate 10 is polished with the main surface 10a side bonded to a support plate, thereby reducing the thickness of the semi-insulating substrate 10 to about 100 μm to about 300 μm. As illustrated in FIG. 12A, a resist mask 81 having openings corresponding to the planar shape of the through holes 11 is formed by a photolithographic technique on the back surface 10b of the semi-insulating substrate 10. As illustrated in FIG. 12B, the semi-insulating substrate 10 is etched with the resist mask 81, thereby forming the through holes 11 in the semi-insulating substrate 10. For the etching of the semi-insulating substrate 10, dry etching is preferably employed. In this step, the etching is performed until the through holes 11 reach the main surface 10a of the semi-insulating substrate 10. In this embodiment, for example, ICP-RIE with a HI-based gas is employed. For the ICP-RIE, it is possible to monitor an emission from species in the plasma, for example, Ga emission at 403 nm and 417 nm, generated when the etch marker layer 31 is etched during the etching. Monitoring the emission from species in the plasma enables the control of the etch depth with high accuracy.

Figure 13A:
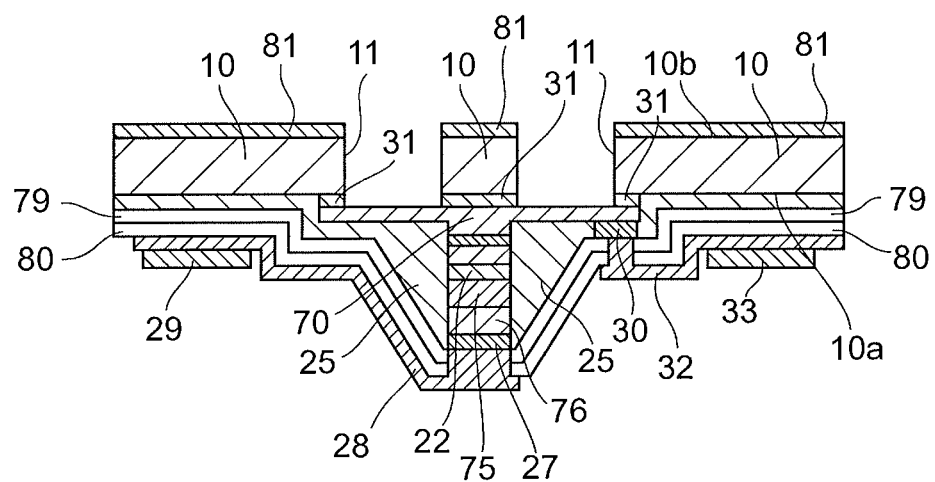
FIGS. 13A and 13B are cross-sectional views illustrating steps in the production method according to the embodiment, each of the views being a cross section (corresponding to the cross section taken along line III-III in FIG. 1A) perpendicular to the waveguiding direction.
Figure 14:
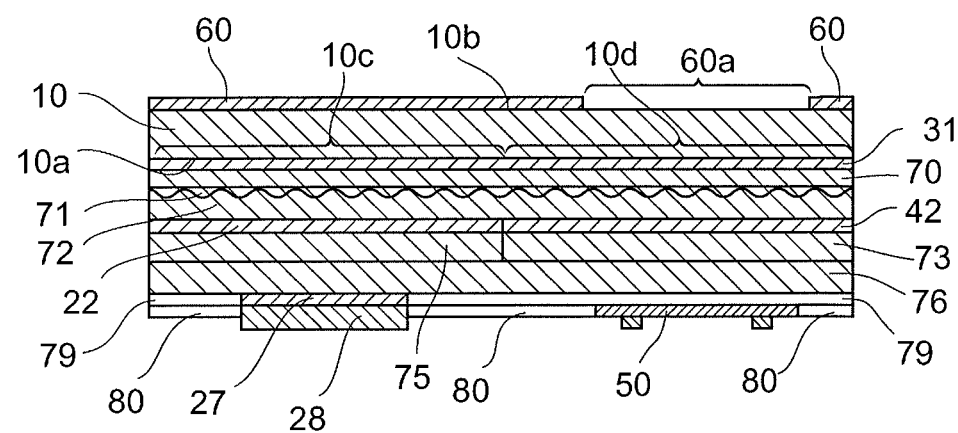
FIG. 14 is a cross-sectional view illustrating a step in the production method, the view being a cross section (corresponding to a cross section taken along line I-I in FIG. 1A) in the waveguiding direction.

As illustrated in FIG. 13A, the etch marker layer 31 exposed in the foregoing step is etched. In this step, the etch marker layer 31 is etched with a mixed solution of sulfuric acid, aqueous hydrogen peroxide, and water (the ratio of sulfuric acid to aqueous hydrogen peroxide to water is 1:1:1 by volume). In this step, the through holes 11 pass through the etch marker layer 31 and reach the n-type buffer layer 70, thereby exposing the n-type buffer layer 70.

Figure 13B:
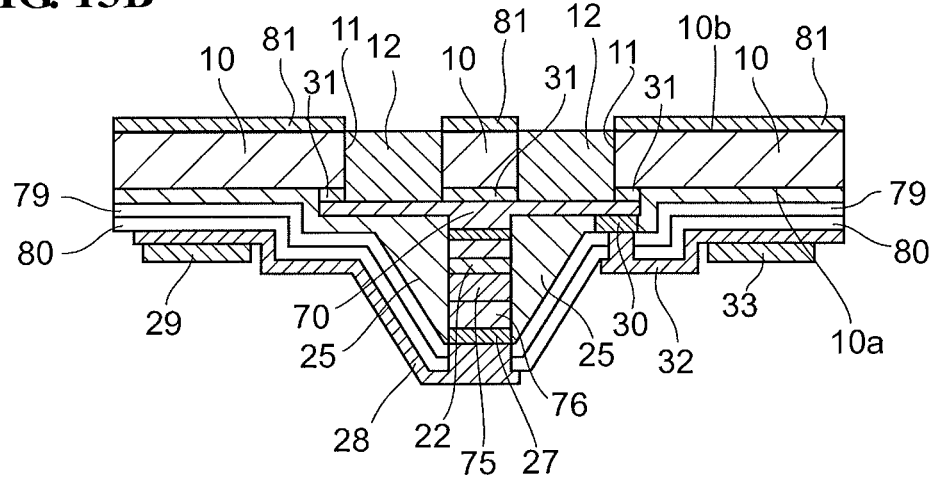

Metal films of Pt/Ti/Pt/Au are deposited on the entire back surface 10b (including inner surfaces of the through holes 11). The metal layers are used for energization for Au plating performed in this step. The metal films serve to increase the adhesion of a Au film to be formed by plating. A resist mask having openings located above the through holes 11 is formed on the metal films by, for example, a photolithographic technique. The metal films are etched with the resist mask to remove an unnecessary portion of the metal films. Then Au plating treatment is performed. The etching of Au is performed for the entire surface on the back surface 10b to remove an unnecessary portion of the resulting Au film. Thereby, as illustrated in FIG. 13B, the metal members 12 which are composed of Au and fill the inside of the through holes 11 are formed.

As illustrated in FIG. 14, the metal film 60 is formed on the back surface 10b of the semi-insulating substrate 10. In this step, a resist mask having an opening is formed on the back surface 10b, the opening being located on a region of the back surface 10b opposite the first region 10c (that is, on a region superimposed on the first region 10c when viewed from the thickness direction of the semi-insulating substrate 10). Metal layers of Ti/Pt/Au are deposited while leaving the resist mask. Then the metal film 60 is formed by a lift-off method. The metal film 60 has the opening 60a located in a region superimposed on the second region 10d when viewed from the thickness direction of the semi-insulating substrate 10 (that is, the wavelength control region 40). After this step, heat treatment is performed at 250° C. to 300° C. to increase the adhesion between the semi-insulating substrate 10 and the metal film 60. The semi-insulating substrate 10 is separated from the support plate that holds the main surface 10a side of the semi-insulating substrate 10. The protective resist arranged on the main surface 10a side is removed. Finally, the semi-insulating substrate 10 is cut into a chip-shaped piece. In this way, the semiconductor optical integrated device 1A illustrated in FIGS. 1A to 1C and 2A and 2B is completed.

Effects of the semiconductor optical integrated device 1A described above will be described together with problems of a semiconductor optical integrated device according to a comparative example.

Figure 16A:
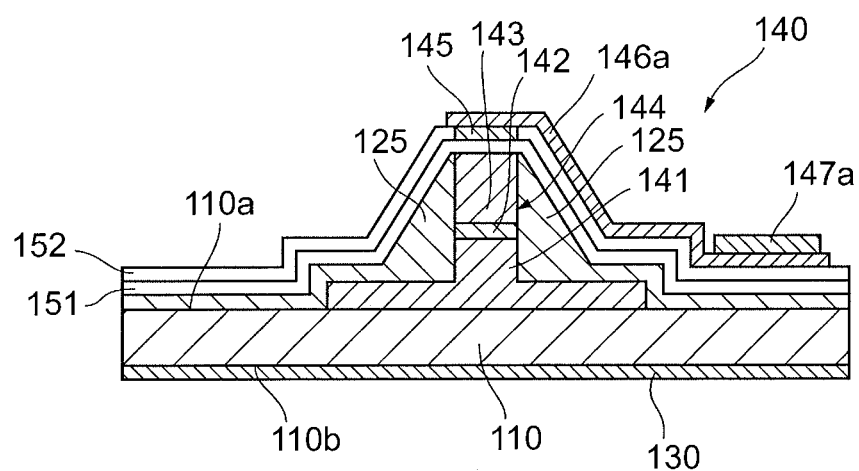
FIGS. 16A and 16B are cross-sectional views of a semiconductor optical integrated device according to a comparative example.
Figure 16B:
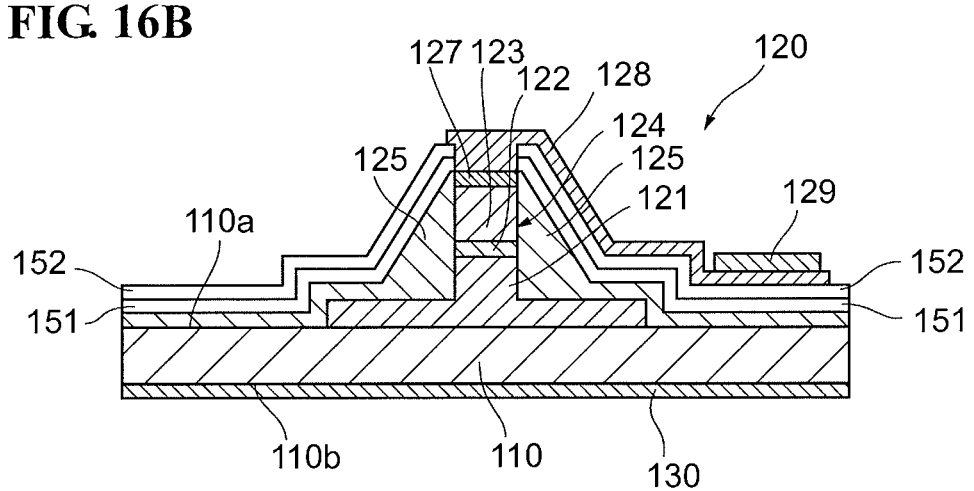

FIGS. 15A to 15C and 16A and 16B illustrate an exemplary semiconductor optical integrated device according to a comparative example, the semiconductor optical integrated device having problems to be solved by the semiconductor optical integrated device 1A according to this embodiment. FIG. 15A is a plan view of the semiconductor optical integrated device 100. FIG. 15B is a bottom view of the semiconductor optical integrated device 100. FIG. 15C is a cross-sectional view taken along line IV-IV in FIG. 15A. FIG. 16A is a cross-sectional view taken along line V-V in FIG. 15A. FIG. 16B is a cross-sectional view taken along line VI-VI in FIG. 15A. As illustrated in FIGS. 15A to 15C and 16A and 16B, the semiconductor optical integrated device 100 includes an n-type semiconductor substrate 110, a gain region 120, and a wavelength control region 140 on a main surface 110a of the n-type semiconductor substrate 110. The gain region 120 and the wavelength control region 140 are arranged on the main surface 110a along a waveguiding direction A1.

As illustrated in FIGS. 15C and 16B, the gain region 120 includes an n-type cladding layer 121, an active layer 122, and a p-type cladding layer 123. The n-type cladding layer 121, the active layer 122, and the p-type cladding layer 123 constitute a stripe-shaped mesa structure 124 and an optical waveguide extending along the waveguiding direction A1. Both side surfaces of the stripe-shaped mesa structure 124 are buried by buried layers 125 composed of semi-insulating semiconductor. Insulating films 151 and 152 are arranged on the buried layers 125. An opening is arranged in portions of the insulating films 151 and 152 on the stripe-shaped mesa structure 124. An electrode 127 arranged on the stripe-shaped mesa structure 124 is in contact with an end of a lead 128 arranged on the insulating film 152 through the opening. A pad electrode 129 for wire bonding is arranged on the other end of the lead 128. An electrode 130 is arranged on the whole of a back surface 110b of the n-type semiconductor substrate 110.

As illustrated in FIGS. 15C and 16A, the wavelength control region 140 includes a lower cladding layer 141, an optical waveguide layer 142, and an upper cladding layer 143. The lower cladding layer 141, the optical waveguide layer 142, and the upper cladding layer 143 constitute a stripe-shaped mesa structure 144 and an optical waveguide extending along waveguiding direction A1. Both side surfaces of the stripe-shaped mesa structure 144 are buried by the buried layers 125 common to the gain region 120. The insulating films 151 and 152 common to the gain region 120 are arranged on the buried layers 125. In the wavelength control region 140, however, there is no opening in portions of the insulating films 151 and 152 on the stripe-shaped mesa structure 144.

The wavelength control region 140 further includes a resistor 145 arranged on the insulating film 151 on the stripe-shaped mesa structure 144. As illustrated in FIGS. 15A and 15C, the resistor 145 extends in the waveguiding direction A1. An end of the resistor 145 in the waveguiding direction A1 is connected to a pad electrode 147a through a lead 146a. The other end in the waveguiding direction A1 is connected to a pad electrode 147b through a lead 146b. The resistor 145 is composed of a metal, such as TiW. When a current fed from the pad electrodes 147a and 147b through the leads 146a and 146b passes through the resistor 145, heat is generated. The wavelength control region 140 controls the temperature of the optical waveguide layer 142 by the heat, thereby changing the effective refractive index of the optical waveguide layer 142. As a result, the wavelength of light that propagates in the optical waveguide layer 142 is selected.

The semiconductor optical integrated device 100 illustrated in FIGS. 15A to 15C and 16A and 16B is required to efficiently conduct heat from the resistor 145 to the optical waveguide layer 142 in the wavelength control region 140 to increase the thermal efficiency. In the semiconductor optical integrated device 100, however, heat escapes easily through the conductive n-type semiconductor substrate 110. In contrast, in the semiconductor optical integrated device 1A illustrated in FIGS. 1A to 1C and 2A and 2B, the wavelength control region 40 is arranged on the semi-insulating substrate 10, so that heat is less likely to escape than the semiconductor optical integrated device 100 illustrated in FIGS. 15A to 15C and 16A and 16B. Furthermore, the semiconductor optical integrated device 1A according to this embodiment includes the etch marker layer 31 arranged between the semi-insulating substrate 10 and the lower cladding layer 41 in the wavelength control region 40. The etch marker layer 31 may be composed of a material, such as InGaAsP, having a lower thermal conductivity than that of the lower cladding layer 41 (InP). It is thus possible to effectively inhibit the escape of heat from the resistor 50 to the semi-insulating substrate 10.

When the metal film 60 used for chip bonding is arranged on the back surface 10b of the semi-insulating substrate 10 as described in this embodiment, the metal film 60 preferably has the opening 60a in a region superimposed on the second region 10d (that is, a region superimposed on the wavelength control region 40) when viewed from the thickness direction of the semi-insulating substrate 10. As a result, when the semiconductor optical integrated device 1A is mounted on a flat mounting surface, a gap (heat insulating layer) is formed between the semi-insulating substrate 10 and the mounting surface. This results in the inhibition of heat transfer from the semi-insulating substrate 10 to the mounting surface in the region. It is thus possible to more effectively inhibit the escape of heat from the resistor 50 to the mounting surface through the semi-insulating substrate 10.

The semiconductor optical integrated device 1A according to this embodiment includes the through holes 11 in the semi-insulating substrate 10 as illustrated in FIGS. 1A to 1C and 2A and 2B. The metal members 12 are arranged in the through holes 11. The metal members 12 allow heat generated in the gain region 20 to escape effectively to the back surface 10b side of the semi-insulating substrate 10, thereby inhibiting degradation in oscillation characteristics due to a change in the temperature of the gain region 20. In particular, in this embodiment, the through holes 11 are formed to pass through the etch marker layer 31 and reach the n-type cladding layer 21 by etching, so that the metal members 12 formed in the through holes 11 are in contact with the n-type cladding layer 21. The contact of the metal members 12 with the n-type cladding layer 21 composed of InP having relatively high thermal conductivity allows heat generated in the gain region 20 to escape more effectively.

As described in this embodiment, the through holes 11 and the metal members 12 are preferably arranged at positions that do not overlap a portion to be formed into an optical waveguide (that is, the stripe-shaped mesa structure 24) in the gain region 20 when viewed from the thickness direction of the semi-insulating substrate 10. This reduces the influence of the metal members 12 to laser light propagating in the optical waveguide. For example, an optical loss in the optical waveguide may be increased when the metal members 12 are arranged in the vicinity of the optical waveguide. Therefore, in the embodiment, an increase in optical loss in the optical waveguide (that is, the stripe-shaped mesa structure 24) due to the metal members 12 can be reduced.

As described in this embodiment, the semi-insulating substrate 10 is used as a substrate that supports the gain region 20 and the wavelength control region 40. This results in low parasitic capacitance, compared with the case where the n-type semiconductor substrate 110 as illustrated in FIGS. 15A to 15C and 16A and 16B is used. For example, even when an optical modulation region that operates at high frequencies is integrated with the gain region 20 and the wavelength control region 40, it is possible to suppress the distortion of a waveform at a high frequency modulation. When the semi-insulating substrate 10 is used as a substrate, current does not flow through the semi-insulating substrate 10. Therefore, the electrode 30 is arranged on the main surface 10a side as described in this embodiment. In this case, the thickness of the n-type cladding layer 21 is determined to reduce an electric resistance in the gain region 20.

According to the semiconductor optical integrated device 1A according to this embodiment described above, the gain region 20 and the wavelength control region 40 are suitably arranged on the semi-insulating substrate 10. This enables the integration of an optical device with an electronic device, such as a hetero junction bipolar transistor (HBT) and thus contributes significantly to increases in the speed and function of an optical communication system and reductions in size and cost of the system.

The semiconductor optical integrated device according to the present invention is not limited to the foregoing embodiment. Various modifications may be made. For example, while the semi-insulating substrate 10 is used in the foregoing embodiment, an insulating substrate may be used in place of the semi-insulating substrate 10. In the foregoing embodiment, the conductivity type of the layers located (on the substrate side) below the active layer is n-type, and the conductivity type of the layers located above the active layer is p-type. However, these conductivity types may be reversed. That is, even when the conductivity type of the layers located (on the substrate side) below the active layer is p-type and where the conductivity type of the layers located above the active layer is n-type, the effects of the present invention can be suitably provided.

While InGaAsP is exemplified as the composition of each of the active layer and the optical waveguide layer in the foregoing embodiment, the composition of each of the active layer and the optical waveguide layer is not limited thereto. For example, each of the active layer and the optical waveguide layer may have an AlGaInAs-based composition.

While the present invention has been specifically described on the basis of the embodiment, the present invention is not limited to the embodiment. Various changes may be made without departing from the gist of the invention.

What is claimed is:

1. A semiconductor optical integrated device comprising:
a substrate having a main surface including a first region and a second region arranged along a waveguiding direction;
a metal film arranged on a back surface of the substrate;
a gain region including a first cladding layer of a first conductivity type, an active layer, and a second cladding layer of a second conductivity type arranged on the first region of the main surface; and
a wavelength control region including a third cladding layer, an optical waveguide layer, and a fourth cladding layer arranged on the second region of the main surface and including a heater arranged along the optical waveguide layer, wherein the substrate includes a through hole that extends from the back surface of the substrate in the thickness direction and that reaches the first region of the main surface,
a metal member is arranged in the through hole, the metal member extending from the back surface of the substrate in the thickness direction and being in contact with the first cladding layer, and
the metal film has an opening formed in a region superimposed on the second region when viewed from the thickness direction of the substrate.

2. The semiconductor optical integrated device according to claim 1,
wherein the substrate is an insulating substrate or a semi-insulating substrate.

3. The semiconductor optical integrated device according to claim 1, wherein
the gain region further includes a stripe-shaped mesa structure including the first cladding layer, the active layer and the second cladding layer extending along the waveguiding direction, and
the through hole and the metal member are arranged at a position that does not overlap the stripe-shaped mesa structure in the gain region when viewed from the thickness direction of the substrate.

4. The semiconductor optical integrated device according to claim 1,
wherein the gain region further includes an etch marker layer arranged between the first cladding layer and the substrate, the etch marker layer being composed of a material different from that of the substrate so as to serve as an etching marker in forming the through hole in the substrate.

5. The semiconductor optical integrated device according to claim 4,
wherein the through hole passes through the etch marker layer and reaches the first cladding layer.

6. The semiconductor optical integrated device according to claim 4,
wherein the wavelength control region includes the etch marker layer arranged between the third cladding layer and the substrate, the etch marker layer having a lower thermal conductivity than that of the third cladding layer.

7. The semiconductor optical integrated device according to claim 1,
wherein the gain region further includes:
a stripe-shaped mesa structure including the first cladding layer, the active layer and the second cladding layer extending along the waveguiding direction;
a first electrode arranged on a top surface of the stripe-shaped mesa structure; and
a second electrode arranged on the first cladding layer other than the stripe-shaped mesa structure.

8. The semiconductor optical integrated device according to claim 1,
wherein the wavelength control region further includes an insulating layer arranged between the fourth cladding layer and the heater.

9. The semiconductor optical integrated device according to claim 1,
wherein the gain region and the wavelength control region further include a diffraction grating layer having periodic projections and recesses.

10. A semiconductor optical integrated device comprising:
a substrate having a main surface including a first region and a second region arranged along a waveguiding direction, the substrate having a through hole that extends from a back surface of the substrate, in the thickness direction, and that reaches the first region of the main surface;

a gain region including a first cladding layer of a first conductivity type, an active layer, a second cladding layer of a second conductivity type arranged on the first region of the main surface, and an etch marker layer arranged between the first cladding layer and the substrate, the etch marker layer being composed of a material different from that of the substrate so as to serve as an etching marker in forming the through hole in the substrate;

a wavelength control region including a third cladding layer, an optical waveguide layer, and a fourth cladding layer arranged on the second region of the main surface and including a heater arranged along the optical waveguide layer; and a metal member arranged in the through hole, the metal member extending from the back surface of the substrate in the thickness direction and being in contact with the first cladding layer.

11. The semiconductor optical integrated device according to claim 10,
wherein the through hole passes through the etch marker layer and reaches the first cladding layer.

12. The semiconductor optical integrated device according to claim 10,
wherein the wavelength control region includes the etch marker layer arranged between the third cladding layer and the substrate, the etch marker layer having a lower thermal conductivity than that of the third cladding layer.

* * * * *